US012672573B2

(12) United States Patent
Chang

(10) Patent No.: US 12,672,573 B2
(45) Date of Patent: Jun. 30, 2026

(54) FLEXIBLE PACKAGE

(71) Applicant: Advanced Semiconductor Engineering, Inc., Kaohsiung (TW)

(72) Inventor: Wei-Hao Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 766 days.

(21) Appl. No.: 17/949,142

(22) Filed: Sep. 20, 2022

(65) Prior Publication Data

US 2024/0096779 A1 Mar. 21, 2024

(51) Int. Cl.
| | |
|---|---|
| *H10W 70/67* | (2026.01) |
| *H10W 70/60* | (2026.01) |
| *H10W 70/65* | (2026.01) |
| *H10W 70/685* | (2026.01) |
| *H10W 74/10* | (2026.01) |
| *H10W 70/655* | (2026.01) |
| *H10W 72/20* | (2026.01) |
| *H10W 74/15* | (2026.01) |
| *H10W 90/00* | (2026.01) |

(52) U.S. Cl.
CPC ........ *H10W 70/688* (2026.01); *H10W 70/611* (2026.01); *H10W 70/65* (2026.01); *H10W 70/685* (2026.01); *H10W 74/114* (2026.01); *H10W 74/121* (2026.01); *H10W 70/655* (2026.01); *H10W 72/252* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 7,019,221 | B1* | 3/2006 | Noda | H05K 1/141 |
| | | | | 361/792 |
| 7,334,326 | B1* | 2/2008 | Huemoeller | H05K 1/162 |
| | | | | 29/25.03 |
| 9,177,832 | B2* | 11/2015 | Camacho | H01L 24/24 |
| 9,778,688 | B2 | 10/2017 | Tang et al. | |
| 10,026,668 | B1* | 7/2018 | Lee | H01L 25/18 |
| 10,468,357 | B2 | 11/2019 | Dias et al. | |
| 2003/0104182 | A1* | 6/2003 | Dow | D03D 15/67 |
| | | | | 428/209 |
| 2006/0087037 | A1* | 4/2006 | Hsu | H01L 21/6835 |
| | | | | 257/738 |
| 2006/0163723 | A1* | 7/2006 | Hsu | H01L 23/49816 |
| | | | | 257/784 |
| 2006/0186531 | A1* | 8/2006 | Hsu | H01L 24/24 |
| | | | | 257/700 |
| 2009/0065920 | A1* | 3/2009 | Ahn | H01L 23/5389 |
| | | | | 438/106 |
| 2010/0164098 | A1* | 7/2010 | Kuechenmeister | H01L 24/11 |
| | | | | 257/E23.06 |
| 2011/0084382 | A1* | 4/2011 | Chen | H01L 23/544 |
| | | | | 257/737 |

(Continued)

*Primary Examiner* — Nicholas J Tobergte

(74) *Attorney, Agent, or Firm* — Foley and Lardner LLP

(57) ABSTRACT

A flexible package is provided. The flexible package includes a first carrier and a second carrier. The second carrier is electrically connected to the first carrier. The second carrier is at least partially embedded in the first carrier, and an electrical connection interface between the first carrier and the second carrier is within the first carrier.

17 Claims, 17 Drawing Sheets

(56)    References Cited

U.S. PATENT DOCUMENTS

| | | | | |
|---|---|---|---|---|
| 2011/0241168 A1* | 10/2011 | Kim | ......................... | H01L 25/16 |
| | | | | 257/532 |
| 2012/0074581 A1* | 3/2012 | Guzek | ...................... | H01L 24/24 |
| | | | | 257/E23.174 |
| 2012/0074586 A1* | 3/2012 | Seo | ................... | H01L 23/49816 |
| | | | | 257/774 |
| 2013/0032390 A1* | 2/2013 | Hu | .................... | H01L 23/49833 |
| | | | | 174/266 |
| 2018/0311562 A1* | 11/2018 | Moyerman | ......... | A63B 69/0026 |
| 2020/0020624 A1* | 1/2020 | Kang | ................ | H01L 23/49833 |
| 2020/0119490 A1* | 4/2020 | Weis | .................... | H01R 12/716 |
| 2021/0082874 A1* | 3/2021 | Chen | ...................... | H01L 21/56 |
| 2022/0223551 A1* | 7/2022 | Kwon | ................... | H01L 24/73 |
| 2023/0326821 A1* | 10/2023 | Mao | ..................... | H01L 21/565 |
| | | | | 257/787 |

* cited by examiner

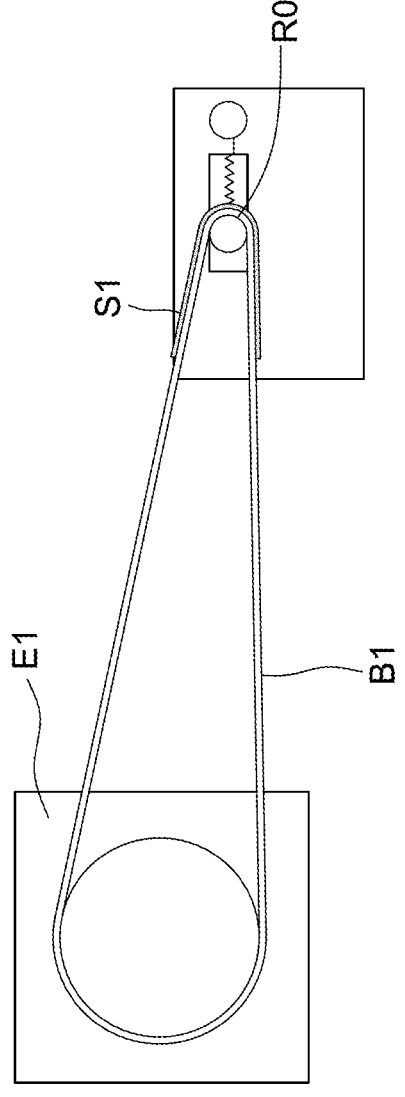
FIG. 1A1

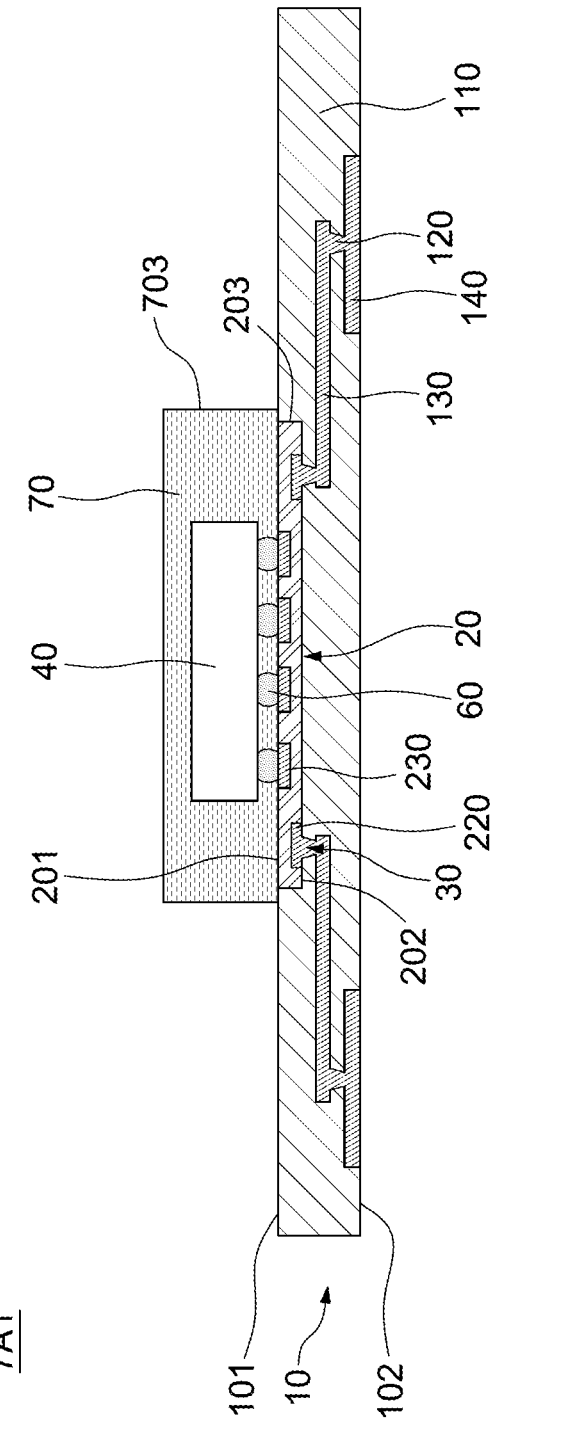
FIG. 7A1

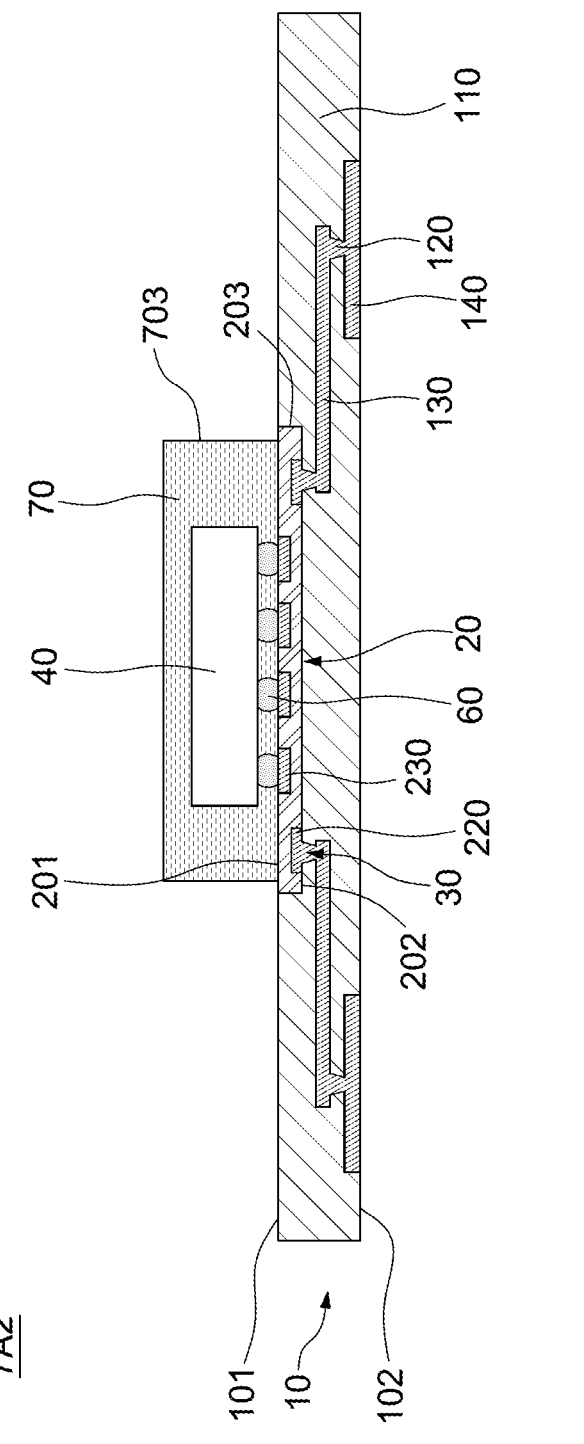
FIG. 7A2

FLEXIBLE PACKAGE

BACKGROUND

1. Technical Field

The present disclosure relates generally to a flexible package.

2. Description of the Related Art

Prominent technological trends in electronic devices, such as improved mobility, decreased size, and enhanced connectivity are changing the electronic device market. Wearable electronic devices constitute a current area of advancement. Such wearable electronic devices utilize a flexible substrate to package required semiconductor devices and/or modules. Other structures disposed over the flexible substrate may still be damaged. Therefore, it is desirable to develop a flexible package addressing such shortcomings.

SUMMARY

In one or more embodiments, a flexible package includes a first carrier and a second carrier. The second carrier is electrically connected to the first carrier. The second carrier is at least partially embedded in the first carrier, and an electrical connection interface between the first carrier and the second carrier is within the first carrier.

In one or more embodiments, a flexible package includes a carrier structure and an electronic component. The carrier structure includes a first region having a first hardness and a second region having a second hardness greater than the first hardness. The electronic component is embedded in the second region.

In one or more embodiments, a flexible package includes a first carrier, a second carrier, and an electronic component. The second carrier is electrically connected to the first carrier through a solder-free connection structure. The first carrier and the second carrier are configured to demonstrate different results after being subjected to a bending test. The electronic component is connected to the second carrier.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A1 is a schematic drawing of a device for performing a bending test in accordance with some embodiments of the present disclosure;

FIG. 7A1 is a cross-section of a flexible package in accordance with some embodiments of the present disclosure;

FIG. 7A2 is a cross-section of a flexible package in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
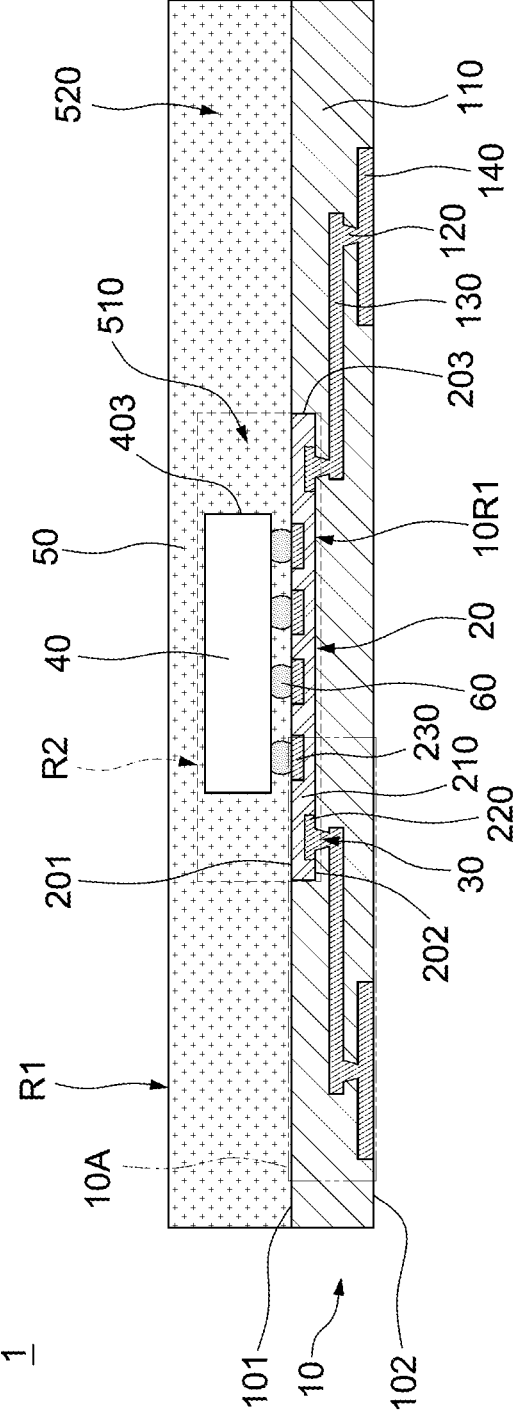
FIG. 1A is a cross-section of a flexible package in accordance with some embodiments of the present disclosure.

FIG. 1A is a cross-section of a flexible package 1 in accordance with some embodiments of the present disclosure. The flexible package 1 includes carriers 10 and 20, an electronic component 40, a protective element 50, and one or more electrical contacts 60.

The carrier 10 may have a surface 101 (also referred to as "a top surface") and a surface 102 (also referred to as "a bottom surface") opposite to the surface 101. The carrier 10 may be or include a substrate. In some embodiments, the carrier 10 includes one or more dielectric layers 110, one or more conductive vias 120, one or more circuit layers 130, and one or more conductive terminals 140. The circuit layers 130 may be or include conductive layers or conductive patterns. In some embodiments, the conductive via 120 electrically connects the circuit layer 130 to the conductive terminal 140. In some embodiments, the conductive via 120 electrically connects the circuit layer 130 to the carrier 20. The conductive terminal 140 may be in proximity to, adjacent to, or embedded in and exposed by the surface 102 for electrical connections. In some embodiments, the carrier 10 includes a flexible substrate. In some embodiments, the carrier 10 includes PI, LCP, or the like. In some embodiments, the carrier 10 may have a glass transition temperature (Tg) equal to or greater than about 300° C., e.g., from about 300° C. to about 450° C. In some embodiments, the carrier 10 has a tensile strength equal to or greater than about 200 MPa. In some embodiments, the carrier 10 includes a flexible printed circuit (FPC) board. In some embodiments, the conductive via 120, the circuit layer 130, and the conductive terminal 140 may independently include a conductive material such as a metal or metal alloy. Examples include gold (Au), silver (Ag), aluminum (Al), copper (Cu), or an alloy thereof.

The carrier 20 may include, for example, a printed circuit board, such as a paper-based copper foil laminate, a composite copper foil laminate, or a polymer-impregnated glass-fiber-based copper foil laminate. In some embodiments, the carrier 20 includes a ceramic material or a metal plate. In some embodiments, the carrier 20 may include a substrate, such as an organic substrate or a leadframe. In some embodiments, the carrier 20 may include a two-layer substrate which includes a core layer and a conductive material and/or structure disposed on a top surface and a bottom surface of the carrier 10. The conductive material and/or structure may include a plurality of traces. In some embodiments, the carrier 20 includes a rigid substrate. In some embodiments, the carrier 20 includes BT, ABF, or the like. In some embodiments, the carrier 20 may have a glass transition temperature (Tg) less than about 300° C., e.g., from about 120° C. to about 280° C. In some embodiments, the CTE of the carrier 10 is equal to or greater than about 20 ppm/° C.

The carrier 20 may be electrically connected to the carrier 10. In some embodiments, the carrier 20 is at least partially embedded in the carrier 10. In some embodiments, as illustrated in FIG. 1A, the carrier 20 is entirely embedded in the carrier 10. The carrier 20 may have a surface 201 (also referred to as "a top surface") and a surface 202 (also referred to as "a bottom surface") opposite to the surface 201. In some embodiments, the surface 201 of the carrier 20 substantially aligns or is coplanar with the surface 101 of the carrier 10. In some embodiments, the carrier 20 includes at least one or more dielectric layers 210 and conductive terminals 220 and 230. The carrier 20 may include an interconnection structure (not shown) electrically connected to the conductive terminals 220 and/or 230, such as one or more conductive traces and/or one or more through vias. The conductive terminals 220 may be in proximity to, adjacent to, or embedded in and exposed by the surface 202 for electrical connections. The conductive terminals 230 may be in proximity to, adjacent to, or embedded in and exposed by the surface 201 for electrical connections. In some embodiments, at least one of the conductive terminal 220 is electrically connected to at least one of the conductive terminals 230 through the interconnection structure. In some embodiments, the conductive terminal 220 is electrically connected to the carrier 10. In some embodiments, the interconnection structure and the conductive terminals 220 and 230 may independently include a conductive material such as a metal or metal alloy. Examples include Au, Ag, Al, Cu, or an alloy thereof.

In some embodiments, the carrier 20 is electrically connected to the carrier 10 through a solder-free connection structure. In some embodiments, the circuit layer 130 of the carrier 10 is electrically connected to the conductive terminal 220 of the carrier 20 through the solder-free connection structure. In some embodiments, an electrical connection interface 30 between the carrier 10 and the carrier 20 is within the carrier 10.

In some embodiments, a hardness of the carrier 10 is less than a hardness of the carrier 20. The term "hardness" hereinafter may refer to a resistance to deformation induced by an external force. The hardness may be defined by scratch hardness, indentation hardness, or the like. In some embodiments, the hardness of the carrier 10 and the carrier 20 may be defined by Young's modulus, tensile stress, Shore hardness, indentation depth, or other suitable properties. In some embodiments, the carrier 10 and the carrier 20 are configured to demonstrate different results after being subjected to a bending test. In some embodiments, the carrier 10 passes the bending test. In some embodiments, the carrier 20 fails the bending test.

FIG. 1A1 is a schematic drawing of a device for performing a bending test in accordance with some embodiments of the present disclosure. The bending test may be performed by the following process according to an international standard "IEC 62715-6-1". A sample S1 (e.g., the carrier 10 and the carrier 20) is disposed on a transporting belt B1 which is driven by an engine E1 to move and carry the sample S1 to pass the roller region R01. Each time the sample S1 passes the roller region R01, the sample S1 is bent once by the curvature provided by the roller region R01, which refers to one bending cycle. The bending test is performed by bending the sample S1 for 300 cycles. The sample S1 is determined as passing the bending test if the internal circuitry of the sample S1 remains on after 300 bending cycles, and the sample S1 is determined as failing the bending test if the internal circuitry of the sample S1 is not conducting after 300 bending cycles.

In some embodiments, a Young's modulus of the carrier 20 is different from a Young's modulus of the carrier 10. In some embodiments, the Young's modulus of the carrier 20 is greater than or exceeds the Young's modulus of the carrier 10. In some embodiments, a CTE of the carrier 20 is less than a CTE of the carrier 10. In some embodiments, the CTE of the carrier 20 is equal to or less than about 20 ppm/° C. In some embodiments, a glass transition temperature (Tg) of the carrier 20 is less than a Tg of the carrier 10.

The electronic component 40 may be disposed on and electrically connected to the carrier 20. In some embodiments, one or more edges (e.g., at least an edge 403) of the electronic component 40 may be recessed with respect to one or more edge (e.g., at least an edge 203) of the carrier 20. In some embodiments, the electronic component 40 is physically spaced apart from the carrier 10. In some embodiments, the electronic component 40 is connected to the carrier 20. In some embodiments, the carrier 20 is configured to serve as a rigid support for the electronic component 40. In some embodiments, the carrier 20 is configured to prevent deformation of the electronic component 40. In some embodiments, the carrier 20 is configured to prevent failure of electrical connection between the carrier 10 and the carrier 20 by preventing the electrical contacts 60 from being damaged or falling off the carrier 20.

The protective element 50 may encapsulate the electronic component 40. In some embodiments, the carrier 10 has a region 10R1 contacting the carrier 20 and spaced apart from the protective element 50. In some embodiments, the protective element 50 has a Young's modulus equal to or less than about 100 MPa. In some embodiments, the Young's modulus of the protective element 50 is about 10 MPa to about 100 MPa. In some embodiments, the protective element 50 has a Tg from about −50° C. to about 25° C. In some embodiments, the protective element 50 is or includes an encapsulant. The encapsulant may include an epoxy resin having fillers, a molding compound (e.g., an epoxy molding compound or other molding compound), polyimide, a phenolic compound or material, a material with a silicone dispersed therein, or a combination thereof.

In some embodiments, the carriers 10 and 20 collectively form a carrier structure including a region R1 and a region R2 having a hardness greater than or exceeding the hardness of the region R1. In some embodiments, the region R2 includes a rigid substrate (e.g., the carrier 20) and an encapsulant portion (e.g., a portion 510 of the protective element 50 that is adjacent to or encapsulates the carrier 20) connected to the rigid substrate. In some embodiments, the electronic component 40 is embedded in the region R2. In some embodiments, the electronic component 40 is electrically connected to the rigid substrate (e.g., the carrier 20) and encapsulated by the encapsulant portion (e.g., the portion 510). In some embodiments, the region R1 includes a flexible substrate (e.g., the carrier 10) and an encapsulant portion (e.g., a portion 520 of the protective element 50) connected to the flexible substrate. In some embodiments, the flexible substrate (e.g., the carrier 10) is electrically connected to the rigid substrate (e.g., the carrier 20). In some embodiments, the encapsulant portion 510 and the encapsulant portion 520 are formed integrally.

The electrical contact 60 may electrically connect the electronic component 40 to the carrier 20. In some embodiments, the electrical contacts 60 include conductive bumps (e.g., stud bumps), controlled collapse chip connection (C4) bumps, a ball grid array (BGA), or a land grid array (LGA). In some embodiments, the electrical contact 60 may be or may include Au, Ag, Cu, another metal, a solder alloy, or a combination of two or more thereof.

According to some embodiments of the present disclosure, with the design of the relatively rigid or hard carrier 20 that is at least partially embedded in the relatively flexible or soft carrier 10, the carrier 10 can provide a flexible base for a wearable device which requires such flexibility, and the carrier 20 that electrically connects to the carrier 10 can provide rigid support for an electronic component 40 (e.g., by limiting or reducing the deformation of the electronic component 40) as well as electrical connection between the electronic component 40 and the carrier 10.

In addition, in some cases where a rigid carrier is disposed over and electrically connected to a flexible carrier through solder joints (e.g., solder balls), the connection between the solder joints and the flexible carrier may crack when the flexible carrier is bent to a relatively large extent. Such solder crack issues may result from the relatively large difference between the deformation of the rigid carrier and the flexible carrier. In contrast, according to some embodiments of the present disclosure, the relatively rigid or hard carrier 20 is electrically connected to the relatively flexible or soft carrier 10 through a solder-free connection structure embedded in the carrier 10, the solder crack issues can be effectively prevented, and the electrical connection interface 30 between the carrier 10 and the carrier 20 is embedded in and well protected by the carrier 10. Therefore, the reliability of the flexible package 1 can be improved.

Moreover, according to some embodiments of the present disclosure, with the design of the regions R1 and R2 of the carrier structure having different hardness, the electronic component 40 is embedded in the region R2 that is configured to reduce deformation, such that the electronic component 40 is protected from damage, and the region R1 can still provide a relatively high flexibility for the applications of the flexible package 1.

Furthermore, according to some embodiments of the present disclosure, with the design of the Young's modulus of the protective element 50 and the characteristics of the carrier 10 when being subjected to a bending test, the protective element 50 can provide protection for the electronic component 40 and maintain flexibility compatible with that of the carrier 10, as the flexible package 1 requires for its applications.

Figure 1B:
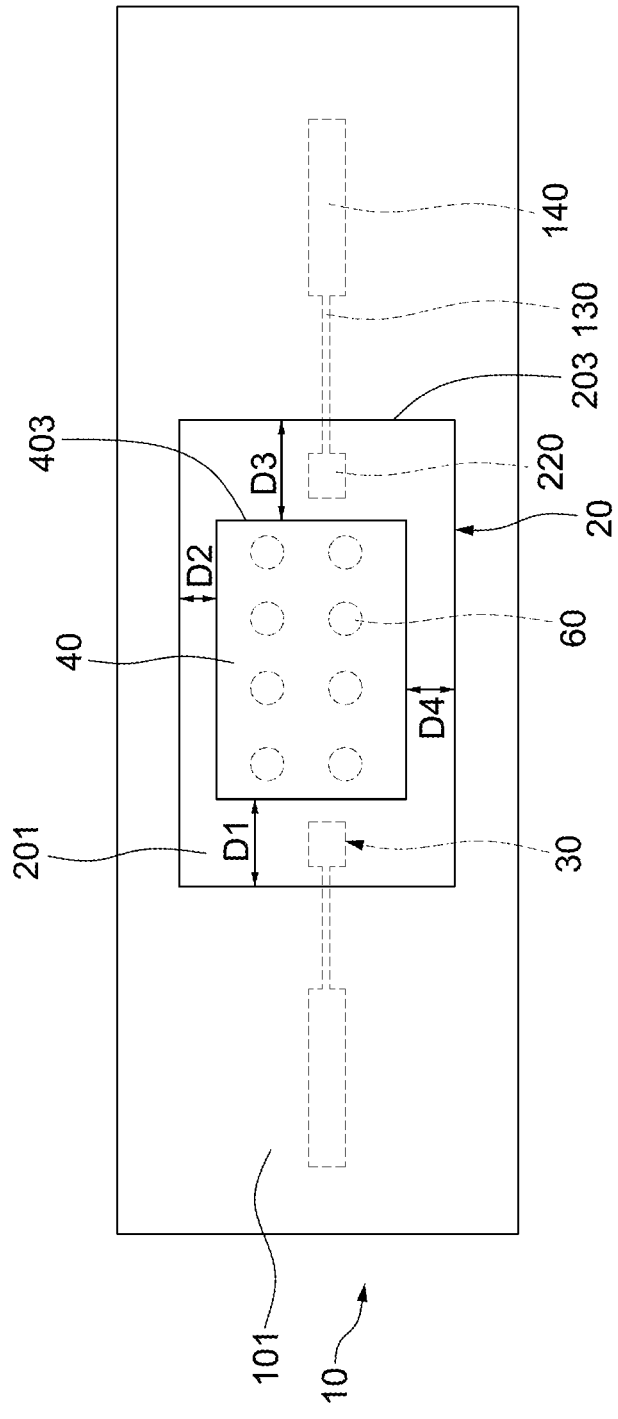
FIG. 1B is a top view of a flexible package in accordance with some embodiments of the present disclosure.

FIG. 1B is a top view of a flexible package in accordance with some embodiments of the present disclosure. In some embodiments, FIG. 1B is a top view of the flexible package 1 illustrated in FIG. 1A, and some elements/components are omitted for clarity.

In some embodiments, an area of the electronic component 40 is less than an area of the carrier 20. In some embodiments, a projection of the electronic component 40 is entirely within a top surface (e.g., the surface 201) of the carrier 20. In some embodiments, the electronic component 40 may have a dimension of about 3 mm×3 mm, and a distance (e.g., distances D1, D2, D3 and/or D4) between an edge of the carrier 20 and an edge of the electronic component 40 is equal to or greater than about 100 µm, about 120 µm, or about 150 µm. In some embodiments, the distances D1, D2, D3 and D4 may be different, or at least two of the distances D1, D2, D3 and D4 can be substantially the same.

According to some embodiments of the present disclosure, with the design of the aforesaid ratio (A1/A2) of an area A1 of the component 40 to an area A2 of the carrier 20, the relatively rigid carrier 20 can provide sufficient support and protection for the electronic component 40, and thus solder crack issues which may result from a relatively large difference between the deformation of the carrier 10 and the carrier 20 can be prevented.

Figure 1C:
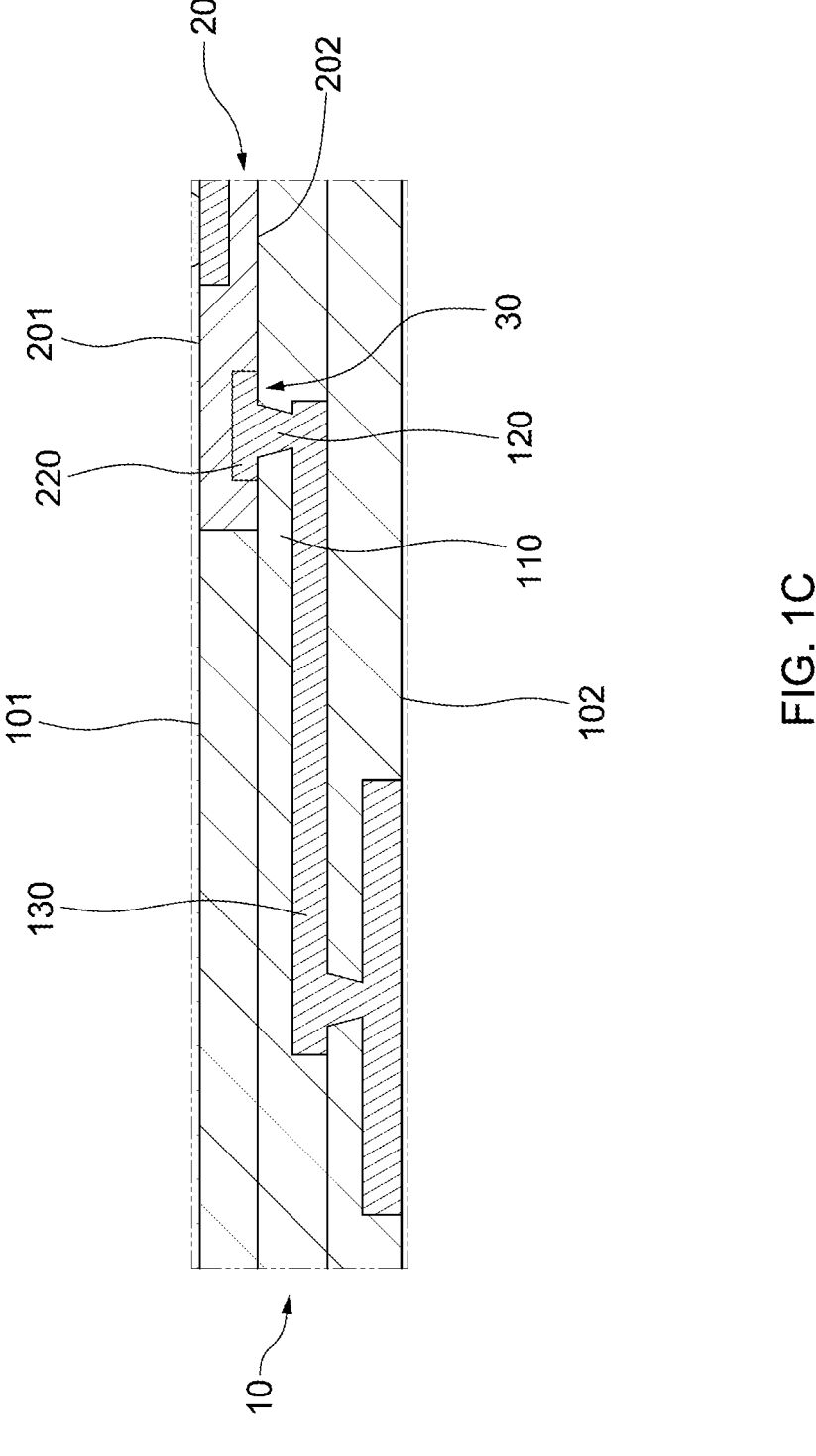
FIG. 1C is a cross-section of a portion of a flexible package in accordance with some embodiments of the present disclosure.

FIG. 1C is a cross-section of a portion of a flexible package in accordance with some embodiments of the present disclosure. In some embodiments, FIG. 1C is a cross-section of a portion 10A of the flexible package 1 illustrated in FIG. 1A.

In some embodiments, the carrier 10 includes a dielectric laminate (e.g., the dielectric layer 110) and a conductive pattern or a conductive pad (e.g., the conductive via 120) exposed by the dielectric laminate, and the carrier 20 includes a conductive pattern or a conductive pad (e.g., the conductive terminal 220) contacting the conductive pattern or the conductive pad (e.g., the conductive via 120) of the carrier 10. In some embodiments, the carrier 10 is electrically connected to the carrier 20 through a solder-free connection structure including the conductive via 120 and the conductive terminal 220. In some embodiments, the carrier 10 may be a build-up substrate including one or more dielectric laminates (e.g., the dielectric layer 110) and a conductive pattern or a conductive pad (e.g., the conductive via 120) exposed by the dielectric laminate, and a conductive gel or a conductive paste (not shown) may be disposed between the carrier 10 and the carrier 20 to electrically connect the conductive pattern or the conductive pad of the carrier 10 to the conductive pattern or the conductive pad of the carrier 20.

In some embodiments, the carrier 10 may be a build-up substrate which may be formed by forming one or more dielectric laminates (e.g., the dielectric layer 110) on the carrier 20, forming one or more through vias in the dielectric laminate to expose a conductive pattern or a conductive pad (e.g., the conductive terminal 220) of the carrier 20, and plating a conductive material or filling a conductive gel (or a conductive paste) in the through via to electrically connect the carrier 10 to the carrier 20. The conductive via 120 may be formed of the plated conductive material or the conductive gel (or the conductive paste) filled in the through via.

Figure 1D:
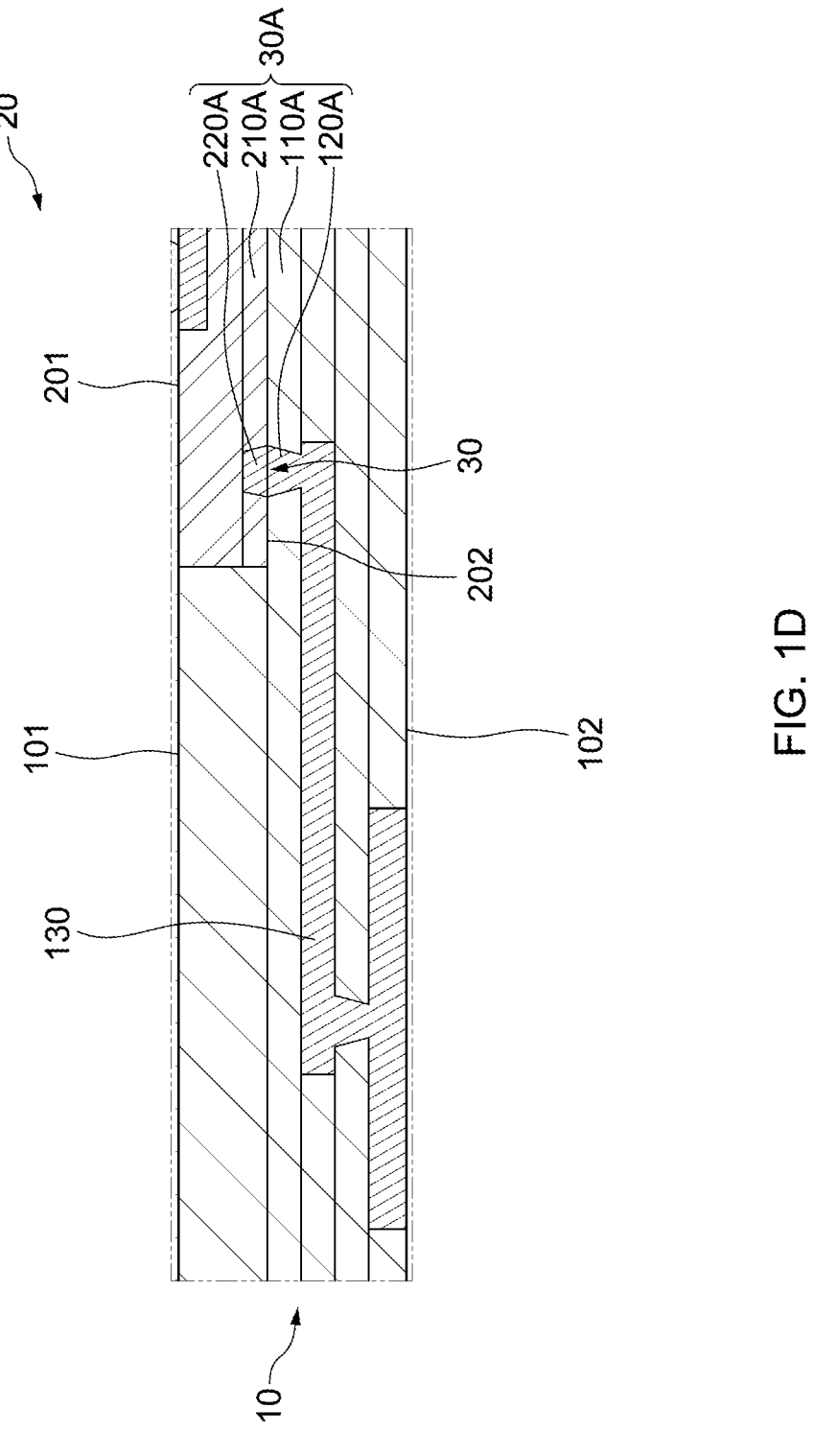
FIG. 1D is a cross-section of a portion of a flexible package in accordance with some embodiments of the present disclosure.

FIG. 1D is a cross-section of a portion of a flexible package in accordance with some embodiments of the present disclosure. In some embodiments, FIG. 1D is a cross-section of a portion 10A of the flexible package 1 illustrated in FIG. 1A.

In some embodiments, the carrier 10 is electrically connected to the carrier 20 through a hybrid bond structure 30A.

In some embodiments, the hybrid bond structure 30A is embedded in the carriers 10 and 20. In some embodiments, the carrier 10 includes a dielectric layer 110A and a hybrid bond pad 120A, and the carrier 20 includes a dielectric layer 210A and a hybrid bond pad 220A. In some embodiments, the hybrid bond structure 30A includes the dielectric layers 110A and 210A and the hybrid bond pads 120A and 220A. In some embodiments, the dielectric layer 110A and the hybrid bond pad 120A are embedded in the carrier 10. In some embodiments, the dielectric layer 210A and the hybrid bond pad 220A are embedded in the carrier 20. In some embodiments, the carrier 10 is electrically connected to the carrier 20 through a solder-free connection structure including the hybrid bond structure 30A.

Figure 2:
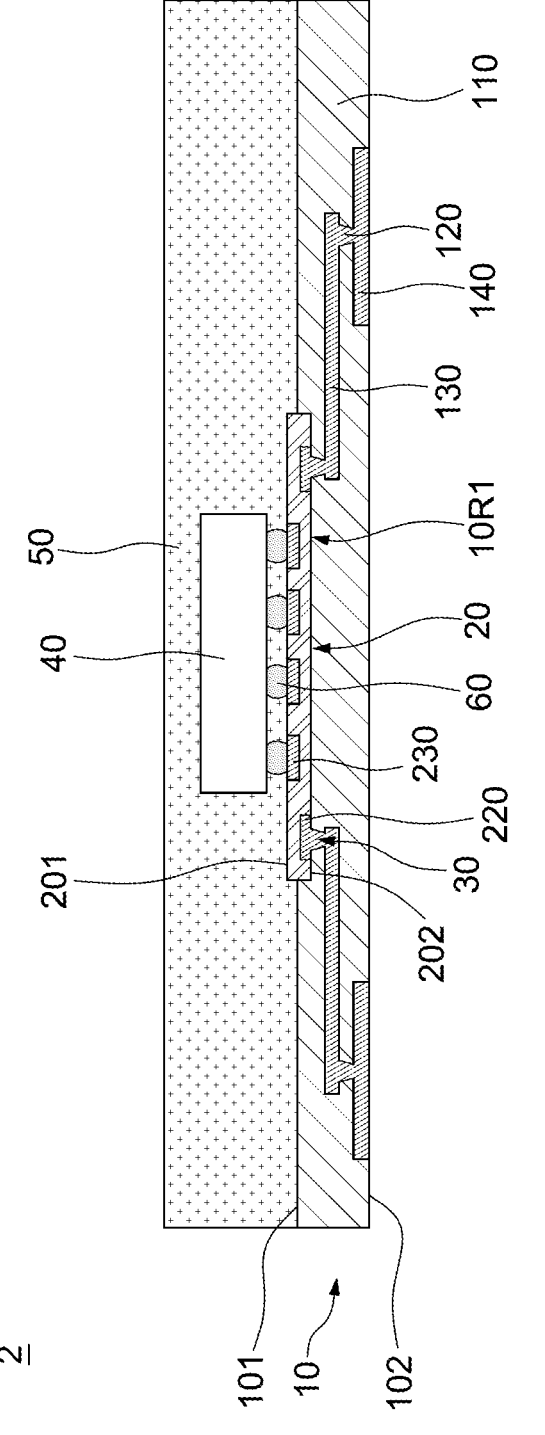
FIG. 2 is a cross-section of a flexible package in accordance with some embodiments of the present disclosure.

FIG. 2 is a cross-section of a flexible package 2 in accordance with some embodiments of the present disclosure. The flexible package 2 is similar to the flexible package 1 in FIG. 1A, with differences therebetween as follows.

In some embodiments, the carrier 20 is partially embedded in the carrier 10. In some embodiments, an elevation of a top surface (e.g., the surface 101) of the carrier 10 is between an elevation of the top surface (e.g., the surface 201) and an elevation of the bottom surface (e.g., the surface 202) of the carrier 20. In some embodiments, an elevation of the surface 201 is higher than or exceeds that of the surface 101 with respect to the surface 102 of the carrier 10. In some embodiments, portions of lateral surfaces of the carrier 20 are encapsulated by the protective element 50.

Figure 3:
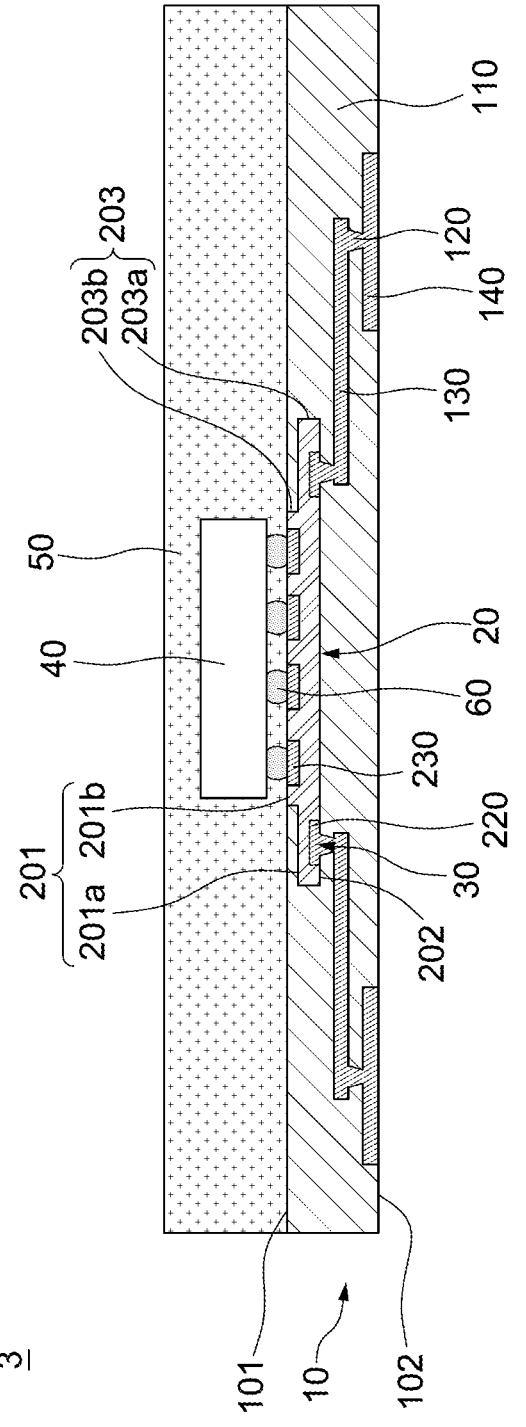
FIG. 3 is a cross-section of a flexible package in accordance with some embodiments of the present disclosure.

FIG. 3 is a cross-section of a flexible package 3 in accordance with some embodiments of the present disclosure. The flexible package 3 is similar to the flexible package 1 in FIG. 1A, with differences therebetween as follows.

In some embodiments, the top surface (e.g., the surface 201) of the carrier 20 includes a portion 201a (also referred to as "a stepped surface") covered by the carrier 10. In some embodiments, the top surface (e.g., the surface 201) of the carrier 20 includes a portion 201b (also referred to as "an elevated surface") substantially coplanar with the top surface (e.g., the surface 101) of the carrier 10. In some embodiments, the carrier 20 includes a stepped structure embedded in the carrier 10. The stepped structure of the carrier 20 may be defined by the portions 201a and 201b of the surface 201. In some embodiments, the stepped surface (e.g., the portion 201a) surrounds the elevated surface (e.g., the portion 201b). In some embodiments, the lateral surface (e.g., the edge 203) of the carrier 20 has a portion 203a and a portion 203b, and the portion 203b is non-coplanar to the portion 203a. In some embodiments, the portion 203a is misaligned with the portion 203b. In some embodiments, the carrier 20 includes a portion (e.g., a recess defined by the portion 201b and the portion 203b) recessed from the lateral surface (e.g., the edge 203) of the carrier 20. In some embodiments, the portion 203b is recessed with respect to the portion 203a. In some embodiments, a portion of the carrier 10 extends into a space between the protective element 50 and the stepped surface of the carrier 20 to interlock with the carrier 20.

According to some embodiments of the present disclosure, with the design of the stepped structure of the carrier 20, the contact area or connection area between the carrier 10 and the carrier 20 can be increased. Therefore, an interlock connection may be formed between the carrier 10 and the carrier 20, the bonding strength can be increased, and thus peeling issues from uneven deformation of the carriers 10 and 20 (e.g., due to CTE mismatch) can be mitigated or prevented.

Figure 4:
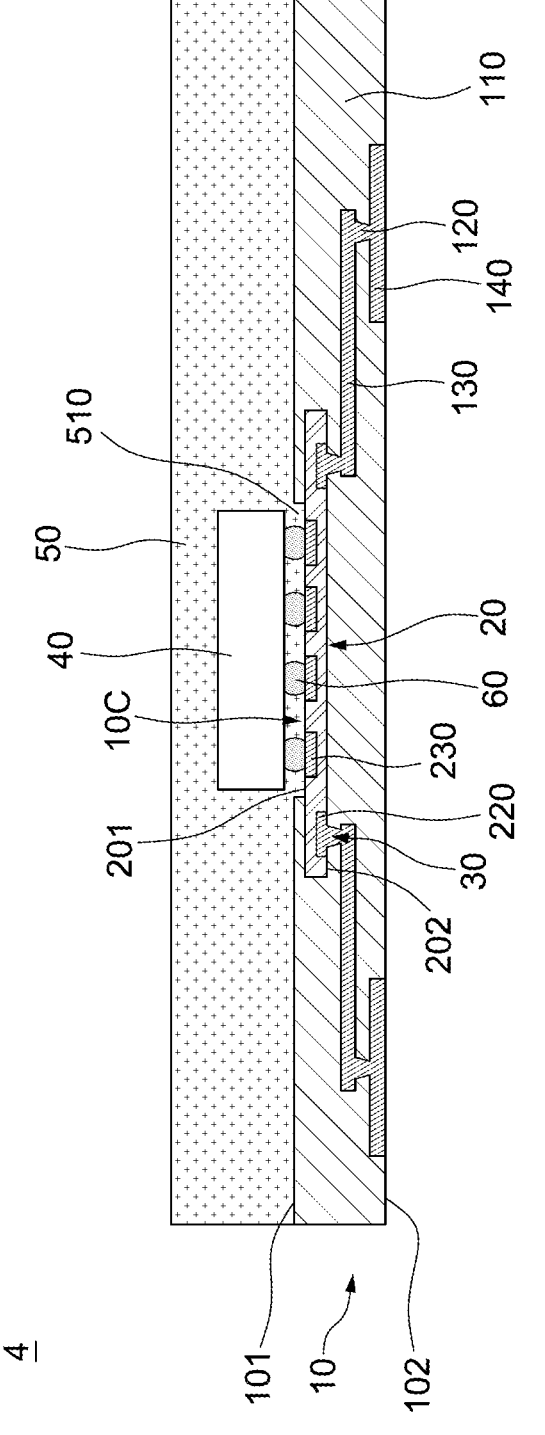
FIG. 4 is a cross-section of a flexible package in accordance with some embodiments of the present disclosure.

FIG. 4 is a cross-section of a flexible package 4 in accordance with some embodiments of the present disclosure. The flexible package 4 is similar to the flexible package 1 in FIG. 1A, with differences therebetween as follows.

In some embodiments, an elevation of the top surface (e.g., the surface 201) of the carrier 20 is lower than an elevation of the top surface (e.g., the surface 101) of the carrier 10 with respect to the surface 102 of the carrier 10. In some embodiments, the carrier 10 defines an opening 10C to expose a portion of the carrier 20. In some embodiments, a portion of the electrical contact 60 is disposed within the opening 10C. In some embodiments, a portion of the protective element 50 is disposed within the opening 10C.

In some embodiments, the protective element 50 includes a protrusion (e.g., the portion 510) embedded in the carrier 10. In some embodiments, the protrusion (e.g., the portion 510) of the protective element 50 contacts the carrier 20. In some embodiments, the electrical contact 60 electrically connects the electronic component 40 to the carrier 20 and is encapsulated by the protrusion (e.g., the portion 510) of the protective element 50.

According to some embodiments of the present disclosure, with the design of the top surface of the carrier 10 and the top surface of the carrier 20 at different elevations, the possible peeling interface between the protective element 50 and the carrier 10 and the possible peeling interface between the protective element 50 and the carrier 20 are discontinuous. Therefore, even when peeling does occur at the interface between the protective element 50 and the carrier 10, such peeling may be disrupted and/or stopped when reaching the discontinuous point between the carrier 10 and carrier 20, and thus peeling between the protective element 50 and the carrier 20 may be prevented, such that the electrical connection between the electrical contacts 60 and the carrier 20 is protected from damage.

Figure 5:
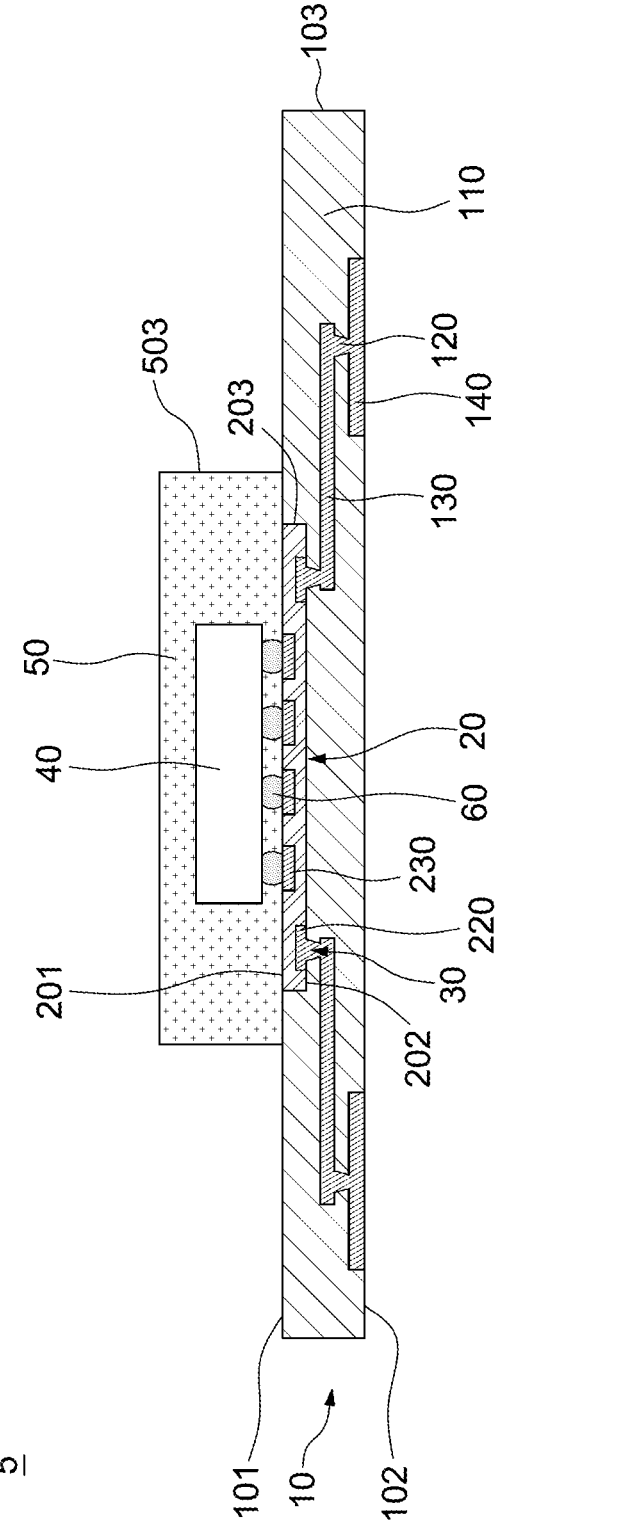
FIG. 5 is a cross-section of a flexible package in accordance with some embodiments of the present disclosure.

FIG. 5 is a cross-section of a flexible package 5 in accordance with some embodiments of the present disclosure. The flexible package 5 is similar to the flexible package 1 in FIG. 1A, with differences therebetween as follows.

In some embodiments, the top surface (e.g., the surface 101) of the carrier 10 has a first portion covered by the protective element 50 and a second portion exposed by the protective element 50. In some embodiments, an edge 503 of the protective element 50 is directly above the surface 101 of the carrier 10. In some embodiments, the edge 503 of the protective element 50 is recessed from an edge 103 of the carrier 10. In some embodiments, the protective element 50 covers the interface between the carrier 10 and the carrier 20, and thus cleavage or delamination between the carriers 10 and 20 can be prevented.

Figure 6:
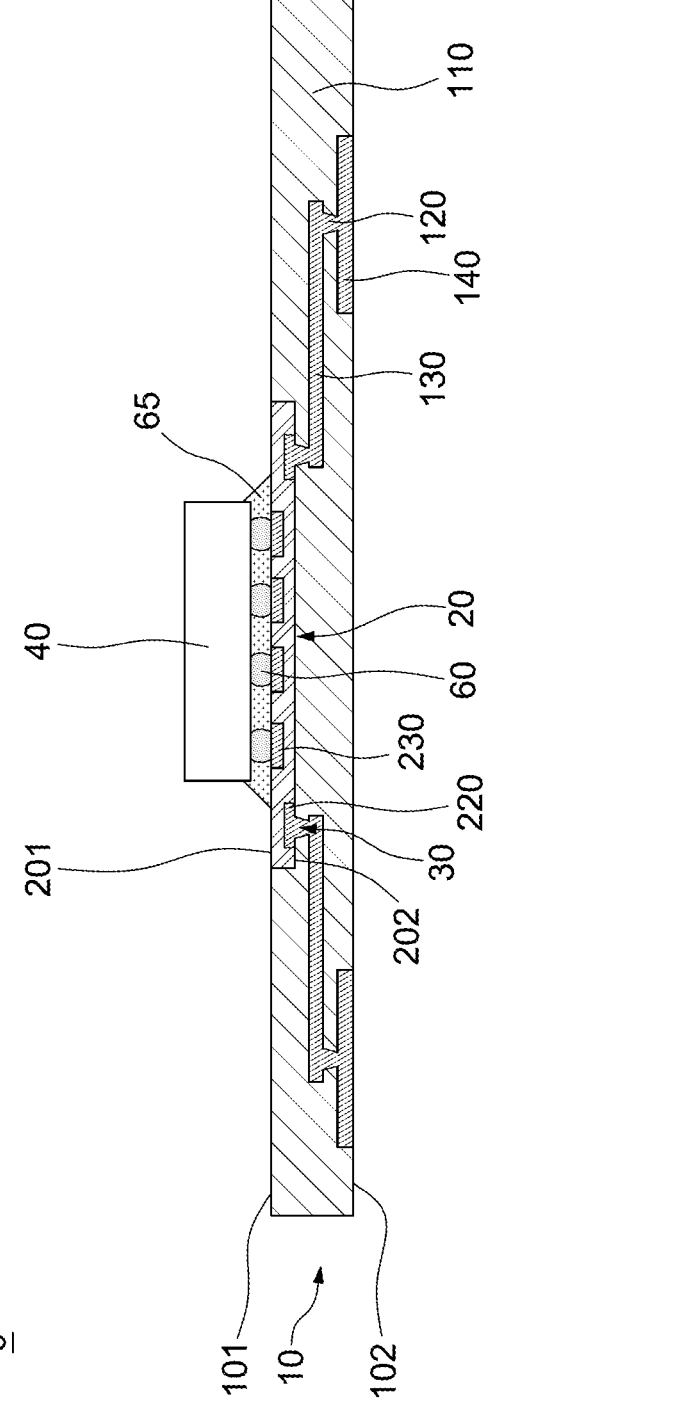
FIG. 6 is a cross-section of a flexible package in accordance with some embodiments of the present disclosure.

FIG. 6 is a cross-section of a flexible package 6 in accordance with some embodiments of the present disclosure. The flexible package 6 is similar to the flexible package 1 in FIG. 1A, with differences therebetween as follows.

In some embodiments, the flexible package 6 includes an underfill 65 encapsulating the electrical contact 60. In some embodiments, a portion of the top surface (e.g., the surface 201) of the carrier 20 is exposed by the underfill 65. In some embodiments, the underfill 65 includes an epoxy resin, a molding compound (e.g., an epoxy molding compound or other molding compound), polyimide, a phenolic compound or material, a material including a silicone dispersed therein, or a combination thereof. According to some embodiments of the present disclosure, the underfill 65 can protect the electrical contacts 60 from being damaged.

Figure 7A:
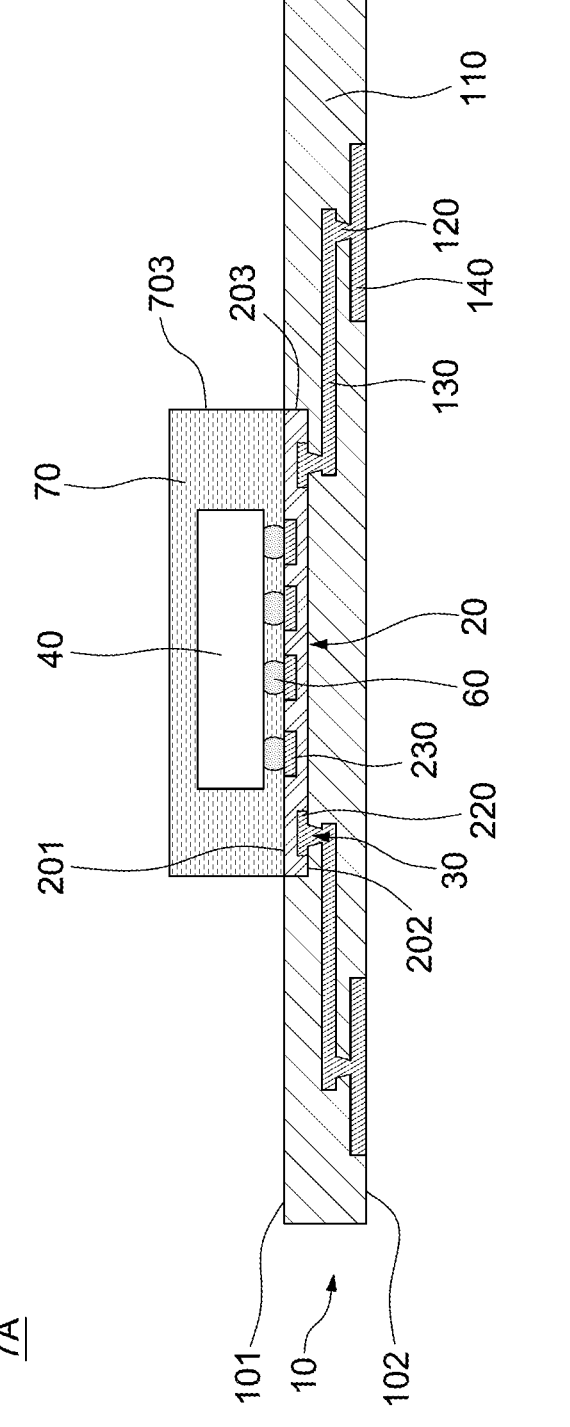
FIG. 7A is a cross-section of a flexible package in accordance with some embodiments of the present disclosure.

FIG. 7A is a cross-section of a flexible package 7A in accordance with some embodiments of the present disclosure. The flexible package 7A is similar to the flexible package 1 in FIG. 1A, with differences therebetween as follows.

In some embodiments, the flexible package 7A includes a protective element 70 encapsulating the electronic component 40. In some embodiments, the protective element 70 has a Young's modulus equal to or greater than about 100 MPa, and an edge 703 of the protective element 70 substantially aligns with an edge 203 of the carrier 20. In some embodiments, the Young's modulus of the protective element 70 is about 5 GPa to about 20 GPa. In some embodiments, the protective element 70 has a Tg from about 100° C. to about 200° C.

According to some embodiments of the present disclosure, with the design of the relatively rigid or hard protective element 70 encapsulating the electronic component 40, rigid support or resistance to deformation for the electronic component 40 is increased, and thus coverage of the protective element 70 can be reduced compared to that of the protective element 50. In addition, according to some embodiments of the present disclosure, with the design of the edge 703 of the protective element 70 substantially aligned with the edge 203 of the carrier 20, the flexible region of the flexible package 7A can be increased.

FIG. 7A1 is a cross-section of a flexible package 7A1 in accordance with some embodiments of the present disclosure. The flexible package 7A1 is similar to the flexible package 7A in FIG. 7A, with differences therebetween as follows.

In some embodiments, one or more edges (e.g., at least the edge 703) of the protective element 70 may exceed one or more edges (e.g., at least the edge 203) of the carrier 20. In some embodiments, the protective element 70 covers an interface between the carrier 10 and the carrier 20, and thus cleavage or delamination between the carriers 10 and 20 can be prevented. In addition, according to some embodiments of the present disclosure, with the design of the edge 703 of the protective element 70 misaligned with the edge 203 of the carrier 20, the possible peeling interface between the carrier 20 and the carrier 10 and the edge 703 of the protective element 70 are discontinuous. Therefore, even when peeling does occur at the interface between the carrier 20 and the carrier 10 when the flexible package 7A1 is bent, such peeling may be disrupted and/or stopped when reaching the discontinuous point under the protective element 70, and thus peeling between the carrier 20 and the carrier 10 may be prevented.

FIG. 7A2 is a cross-section of a flexible package 7A2 in accordance with some embodiments of the present disclosure. The flexible package 7A2 is similar to the flexible package 7A in FIG. 7A, with differences therebetween as follows.

In some embodiments, one or more edges (e.g., at least the edge 703) of the protective element 70 may be recessed with respect to one or more edges (e.g., at least the edge 203) of the carrier 20. According to some embodiments of the present disclosure, with the design of the edge 703 of the protective element 70 recessed with respect to the edge 203 of the carrier 20, the flexible region of the flexible package 7A2 can be increased.

Figure 7B:
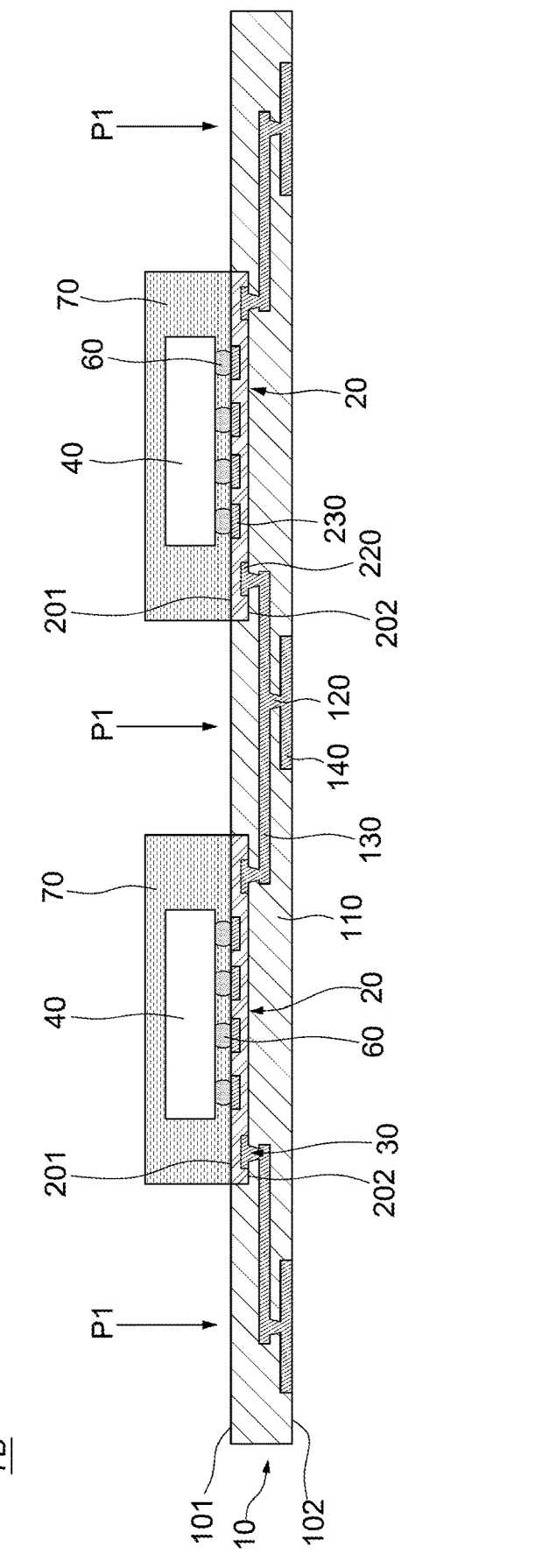
FIG. 7B is a cross-section of a flexible package in accordance with some embodiments of the present disclosure.

FIG. 7B is a cross-section of a flexible package 7B in accordance with some embodiments of the present disclosure. The flexible package 7B is similar to the flexible package 7A in FIG. 7A, with differences therebetween as follows.

In some embodiments, the flexible package 7B includes a carrier 10, a plurality of carriers 20 embedded in the carrier 10, a plurality of electronic components 40 each electrically connected to a corresponding carrier 20, and a plurality of protective elements 70 each encapsulating a corresponding electronic component 40. In some embodiments, the electronic components 40 are electrically connected through the carrier 10. In some embodiments, the circuit layer 130 electrically connects the electronic components 40. In some embodiments, one or more edges (e.g., at least the edge 703) of the protective element 70 may be exceeding or recessed with respect to one or more edges (e.g., at least the edge 203) of the carrier 20.

According to some embodiments of the present disclosure, with the design of the protective elements 70 discretely arranged on and connected to separate positions of the flexible carrier 10, stress (e.g., bending stress) can be redistributed to the less rigid portions P1 of the carrier 10 between the protective elements 70. Therefore, the electronic components 40 encapsulated by the protective elements 70 may be subject to less stress, and damage to the electronic components 40 further prevented.

Figure 8A:
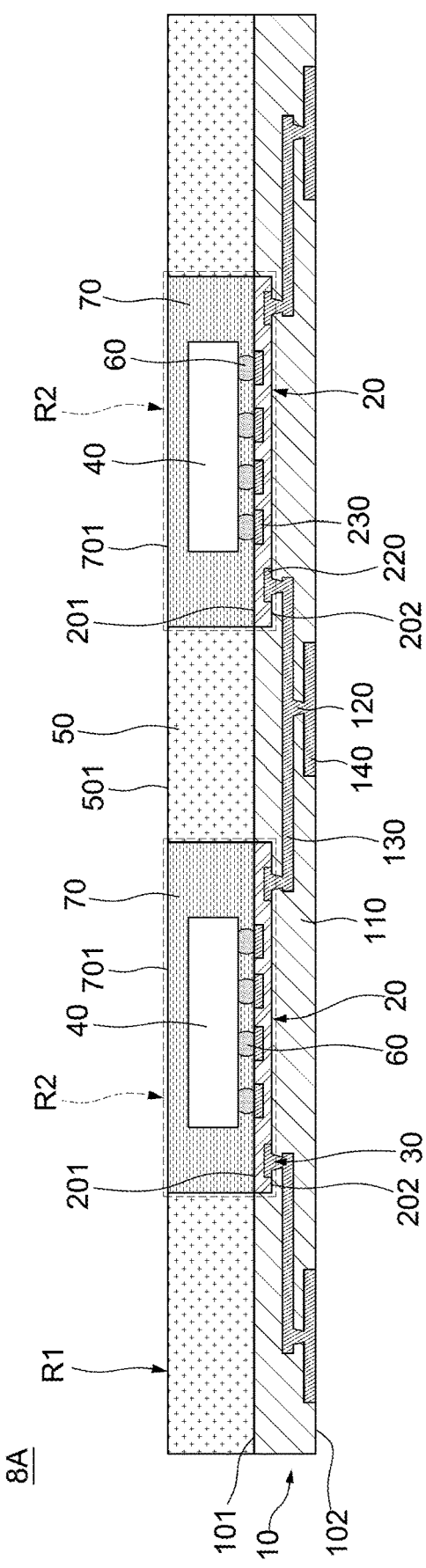
FIG. 8A is a cross-section of a flexible package in accordance with some embodiments of the present disclosure.

FIG. 8A is a cross-section of a flexible package 8A in accordance with some embodiments of the present disclosure. The flexible package 8A is similar to the flexible package 7B in FIG. 7B, with differences therebetween as follows.

In some embodiments, the flexible package 8 includes a carrier 10, a plurality of carriers 20 embedded in the carrier 10, a plurality of electronic components 40 each electrically connected to a corresponding carrier 20, a plurality of protective element 70 each encapsulating a corresponding electronic component 40, and a protective element 50 encapsulating the protective elements 70. In some embodiments, the protective element 70 is between the electronic component 40 and the protective element 50, and a Young's modulus of the protective element 50 is less than a Young's modulus of the protective element 70. In some embodiments, the protective element 50 contacts the protective elements 70. In some embodiments, a top surface 501 of the protective element 50 substantially aligns with top surfaces 701 of the protective elements 70. In other embodiments, the protective element 50 may cover the top surfaces 701 of the protective elements 70. In some embodiments, the protective element 50 is spaced apart from the surface 201 of the carrier 20. In some embodiments, one or more edges (e.g., at least the edge 703) of the protective element 70 may be exceeding or recessed with respect to one or more edges (e.g., at least the edge 203) of the carrier 20.

In some embodiments, the carriers 10 and 20 collectively form a carrier structure including a region R1 and a region R2 having a hardness greater than or exceeding the hardness of the region R1. In some embodiments, the region R1 includes the carrier 10 (e.g., the flexible carrier or substrate), and the region R2 includes the carrier 20 (e.g., the rigid carrier or substrate). In some embodiments, the region R1 includes the protective element 50 (e.g., the relatively flexible or soft protective element), and the region R2 includes the protective element 70 (e.g., the relatively rigid or hard protective element).

Figure 8B:
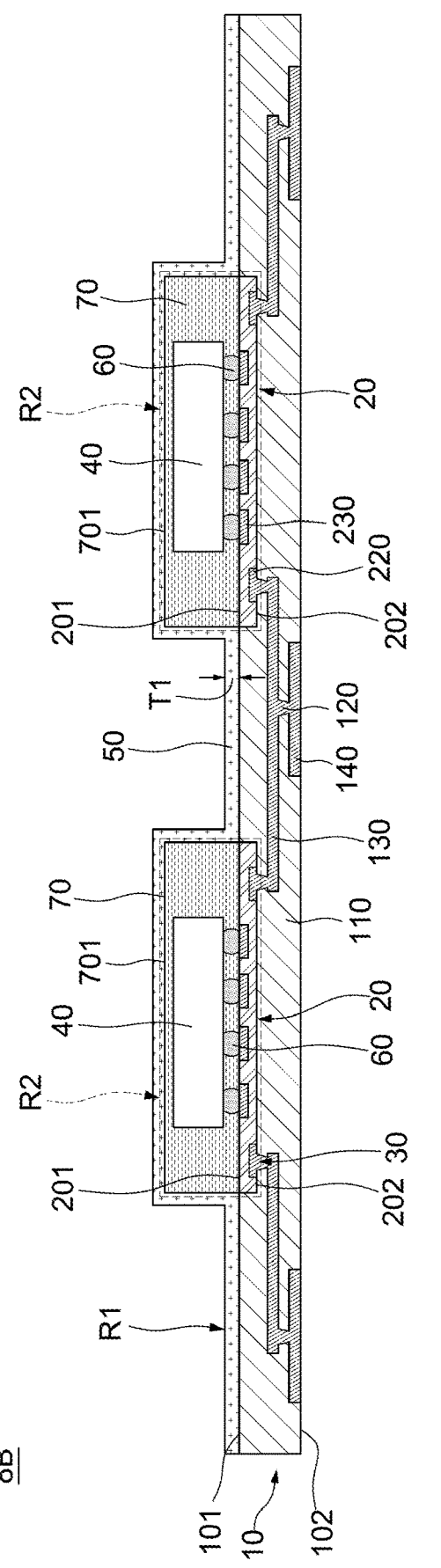
FIG. 8B is a cross-section of a flexible package in accordance with some embodiments of the present disclosure.

FIG. 8B is a cross-section of a flexible package 8B in accordance with some embodiments of the present disclosure. The flexible package 8B is similar to the flexible package 8A in FIG. 8A, with differences therebetween as follows.

In some embodiments, the protective element 50 is conformal with the profile of the protective elements 70. In some embodiments, the protective element 50 has a substantially constant thickness Ti. In some embodiments, one or more edges (e.g., at least the edge 703) of the protective element 70 may be exceeding or recessed with respect to one or more edges (e.g., at least the edge 203) of the carrier 20.

Figure 9:
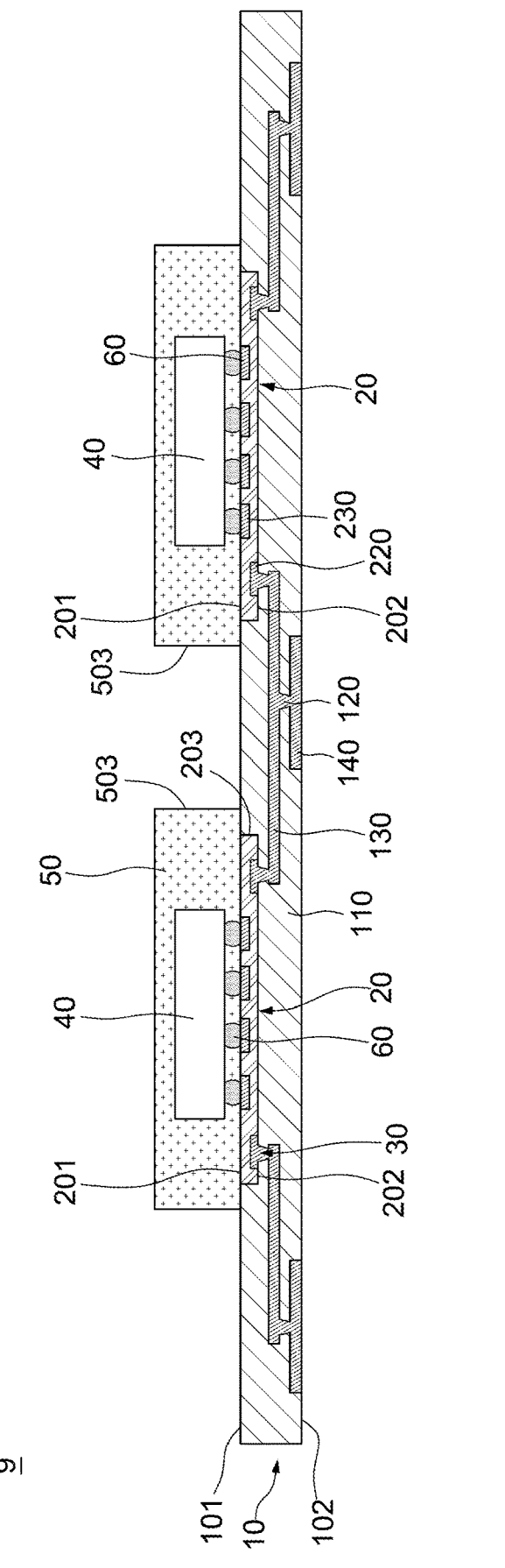
FIG. 9 is a cross-section of a flexible package in accordance with some embodiments of the present disclosure.

FIG. 9 is a cross-section of a flexible package 9 in accordance with some embodiments of the present disclosure. The flexible package 9 is similar to the flexible package 5 in FIG. 5, with differences therebetween as follows.

In some embodiments, the flexible package 9 includes a carrier 10, a plurality of carriers 20 embedded in the carrier 10, a plurality of electronic components 40 each electrically connected to a corresponding carrier 20, and a plurality of protective elements 50 each encapsulating a corresponding electronic component 40. In some embodiments, the electronic components 40 are electrically connected through the carrier 10. In some embodiments, the circuit layer 130 electrically connects the electronic components 40. In some embodiments, edges 503 of adjacent protective elements 50 are spaced apart from each other. In some embodiments, an edge 203 of the carrier 20 is recessed from the edge 503 of the protective element 50. In some embodiments, the protective element 50 covers the interface between the carrier 10 and the carrier 20, and thus cleavage or delamination between the carriers 10 and 20 can be prevented.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A flexible package, comprising:

a first carrier; and a second carrier electrically connected to the first carrier, wherein the second carrier is at least partially embedded in the first carrier, and an electrical connection interface between the first carrier and the second carrier is within the first carrier, wherein a hardness of the second carrier is greater than a hardness of the first carrier, wherein a top surface of the second carrier comprises a first portion covered by the first carrier.

2. The flexible package as claimed in claim 1, wherein a CTE or a glass transition temperature (Tg) of the second carrier is less than a CTE or a Tg of the first carrier.

3. The flexible package as claimed in claim 1, wherein the second carrier has a bottom surface opposite to the top surface, and an elevation of a top surface of the first carrier is between an elevation of the top surface and an elevation of the bottom surface of the second carrier.

4. The flexible package as claimed in claim 1, wherein the second carrier has a lateral surface angled with the top surface, and the lateral surface has a first portion and a second portion non-coplanar to the first portion.

5. The flexible package as claimed in claim 1, wherein the top surface of the second carrier further comprises a second portion substantially coplanar with a top surface of the first carrier.

6. The flexible package as claimed in claim 1, wherein the first carrier has a top surface and a bottom surface opposite to the top surface, and an elevation of the top surface of the second carrier is lower than an elevation of the top surface of the first carrier with respect to the bottom surface of the first carrier.

7. The flexible package as claimed in claim 1, further comprising an electronic component disposed on and electrically connected to the second carrier, wherein a projection of the electronic component is entirely within the top surface of the second carrier.

8. The flexible package as claimed in claim 7, further comprising a first protective element encapsulating the electronic component, wherein the first carrier has a first region contacting the second carrier and spaced apart from the first protective element.

9. The flexible package as claimed in claim 8, wherein the first protective element comprises a protrusion embedded in the first carrier.

10. The flexible package as claimed in claim 8, wherein a top surface of the first carrier has a first portion covered by the first protective element and a second portion exposed by the first protective element.

11. The flexible package as claimed in claim 8, an edge of the first protective element is substantially aligned with or recessed with respect to an edge of the second carrier.

12. The flexible package as claimed in claim 8, further comprising a second protective element between the electronic component and the first protective element, wherein a Young's modulus of the first protective element is less than a Young's modulus of the second protective element.

13. The flexible package as claimed in claim 9, wherein the protrusion of the first protective element contacts the second carrier and lateral surfaces of the first carrier.

14. The flexible package as claimed in claim 13, wherein a width of the protrusion is greater than a width of the electronic component and less than a width of the second carrier.

15. The flexible package as claimed in claim 13, wherein a contact interface between the first carrier and the protective element and a contact interface between the second carrier and the protective element are at different elevations.

16. The flexible package as claimed in claim 1, wherein the first carrier is electrically connected to the second carrier through a solder-free connection structure comprising the electrical connection interface.

17. The flexible package as claimed in claim 1, further comprising a protective element over the first carrier, wherein the second carrier comprises a stepped structure, and the first carrier comprises a portion extending into a space between the protective element and a stepped surface of the stepped structure to interlock with the second carrier.

* * * * *